(12) United States Patent
Griebenow et al.

(10) Patent No.: US 8,440,534 B2
(45) Date of Patent: May 14, 2013

(54) THRESHOLD ADJUSTMENT FOR MOS DEVICES BY ADAPTING A SPACER WIDTH PRIOR TO IMPLANTATION

(75) Inventors: Uwe Griebenow, Markkleeberg (DE); Jan Hoentschel, Dresden (DE); Kai Frohberg, Niederau (DE); Heike Berthold, Hirschfeld (DE); Katrin Reiche, Goltzscha (DE); Frank Feustel, Dresden (DE); Kerstin Ruttloff, Hainichen (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 13/104,474

(22) Filed: May 10, 2011

(65) Prior Publication Data

US 2011/0223732 A1    Sep. 15, 2011

Related U.S. Application Data

(63) Continuation of application No. 12/413,765, filed on Mar. 30, 2009, now abandoned.

(30) Foreign Application Priority Data

Jun. 30, 2008   (DE) .......................... 10 2008 030 856

(51) Int. Cl.
*H01L 21/336* (2006.01)
*H01L 21/8234* (2006.01)

(52) U.S. Cl.
USPC ................... 438/302; 438/275; 257/E21.626

(58) Field of Classification Search .................. 438/275, 438/302, 525; 257/E21.626
See application file for complete search history.

(56) References Cited

U.S. PATENT DOCUMENTS

| | | | | |
|---|---|---|---|---|
| 3,751,722 | A * | 8/1973 | Richman | 257/399 |
| 4,525,378 | A * | 6/1985 | Schwabe et al. | 438/217 |
| 6,080,613 | A | 6/2000 | Seo et al. | 438/238 |
| 6,187,643 | B1 * | 2/2001 | Borland | 438/302 |
| 6,403,487 | B1 | 6/2002 | Huang et al. | 438/706 |
| 6,534,405 | B1 * | 3/2003 | Wu | 438/682 |
| 6,617,214 | B2 | 9/2003 | Yeap et al. | 438/283 |
| 7,119,408 | B2 | 10/2006 | Kotani | 257/408 |
| 7,316,975 | B2 | 1/2008 | Lenski et al. | 438/689 |
| 2004/0188726 | A1 * | 9/2004 | Iriyama et al. | 257/288 |
| 2004/0219755 | A1 * | 11/2004 | Rabkin et al. | 438/299 |
| 2005/0179078 | A1 | 8/2005 | Lee | 257/314 |
| 2006/0115988 | A1 * | 6/2006 | Lenski et al. | 438/705 |
| 2006/0151840 | A1 | 7/2006 | Maekawa | 257/384 |
| 2009/0108295 | A1 | 4/2009 | Mowry et al. | 257/190 |

FOREIGN PATENT DOCUMENTS

DE    102004057809 A1    6/2006

OTHER PUBLICATIONS

Translation of Official Communication from German Patent Office for German Patent Application No. 10 2008 030 856.0-33 dated Feb. 12, 2009.

* cited by examiner

*Primary Examiner* — Daniel Luke
(74) *Attorney, Agent, or Firm* — Williams, Morgan & Amerson, P.C.

(57) ABSTRACT

Different threshold voltages of transistors of the same conductivity type in a complex integrated circuit may be adjusted on the basis of different Miller capacitances, which may be accomplished by appropriately adapting a spacer width and/or performing a tilted extension implantation. Thus, efficient process strategies may be available to controllably adjust the Miller capacitance, thereby providing enhanced transistor performance of low threshold transistors while not unduly contributing to process complexity compared to conventional approaches in which threshold voltage values may be adjusted on the basis of complex halo and well doping regimes.

17 Claims, 7 Drawing Sheets

THRESHOLD ADJUSTMENT FOR MOS DEVICES BY ADAPTING A SPACER WIDTH PRIOR TO IMPLANTATION

CROSS-REFERENCE TO RELATED APPLICATION

This is a continuation of application Ser. No. 12/413,765, filed Mar. 30, 2009 now abandoned.

BACKGROUND OF THE INVENTION

1. Field of the Invention

The present disclosure generally relates to the fabrication of integrated circuits, and, more particularly, to the fabrication of highly sophisticated integrated circuits including transistor structures of different threshold voltages.

2. Description of the Related Art

The manufacturing process for integrated circuits continues to improve in several ways, driven by the ongoing efforts to scale down the feature sizes of the individual circuit elements. A key issue in developing integrated circuits of increased packing density and enhanced performance is the scaling of transistor elements, such as MOS transistor elements, to increase the number of transistor elements in order to enhance performance of modern CPUs and the like with respect to operating speed and functionality. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, which may also be referred to as a substrate or a well region.

Although the reduction of the gate length is necessary for obtaining smaller and faster transistor elements, it turns out, however, that a plurality of issues are additionally involved to maintain proper transistor performance for a reduced gate length. For example, so-called short channel effects may occur for highly scaled transistor elements, resulting in a reduced controllability of the channel region, which may result in increased leakage currents and generally in degraded transistor performance. One challenging task in this respect, therefore, is the provision of appropriately designed junction regions in the form of shallow junctions, at least at the area in the vicinity of the channel region, i.e., source and drain extension regions, which nevertheless exhibit a moderately high conductivity so as to maintain the resistivity in conducting charge carriers from the channel to a respective contact area of the drain and source regions at a relatively low level while also controlling the parasitic drain/source capacitance and the electric field of the cut-off region. The requirement for shallow junctions having a relatively high conductivity while providing adequate channel control is commonly met by performing an ion implantation sequence on the basis of a spacer structure so as to obtain a high dopant concentration having a profile that varies laterally and in depth. The introduction of a high dose of dopants into a crystalline substrate area, however, generates heavy damage in the crystal structure, and therefore one or more anneal cycles are typically required for activating the dopants, i.e., for placing the dopants at crystal sites, and to cure the heavy crystal damage. However, the electrically effective dopant concentration is limited by the ability of the anneal cycles to electrically activate the dopants. This ability in turn is limited by the solid solubility of the dopants in the silicon crystal and the temperature and duration of the anneal process that are compatible with the process requirements. Moreover, besides the dopant activation and the curing of crystal damage, dopant diffusion may also occur during the annealing, which may lead to a "blurring" of the dopant profile. This effect may be advantageous in some cases for defining critical transistor properties, such as the overlap between the extension regions and the gate electrode. Therefore, for highly advanced transistors, the positioning, shaping and maintaining of a desired dopant profile are important properties for defining the final performance of the device, since the overall series resistance of the conductive path between the drain and source contacts as well as the controllability of the channel region may represent a dominant aspect for determining the transistor performance.

Moreover, other important transistor characteristics may presently also be adjusted on the basis of the complex dopant profile in the active regions of the transistor elements. For example, the threshold voltage of a transistor, i.e., the voltage applied between the gate electrode and the source terminal of the transistor element, at which a conductive channel forms in the channel region, is a transistor characteristic that substantially affects overall transistor performance. Typically, the ongoing shrinkage of critical dimensions of the transistors may also be associated with a continuous reduction of the supply voltage of electronic circuitry. Consequently, for performance-driven transistor elements, the corresponding threshold voltage may also have to be reduced in order to obtain a desired high saturation current at a reduced gate voltage, since the reduced supply voltage may also restrict available voltage swing for controlling the channel of the transistor. However, the reduction of the threshold voltage, which may typically be accomplished by appropriately doping the well region of the transistor in combination with sophisticated halo implantation processes, which are designed to provide the appropriate dopant gradient at the PN junctions and the overall conductivity of the channel region, may also affect the static leakage currents of the transistors. That is, by lowering the threshold voltage, typically, the off current of the transistors may increase, thereby contributing to the overall power consumption of an integrated circuit, which may comprise millions of corresponding transistor elements. In addition to increased leakage currents caused by extremely thin gate dielectric materials, the static power consumption may result in unacceptable high power consumption, which may not be compatible with the heat dissipation capabilities of integrated circuits designed for general purposes. In an attempt to maintain the overall static leakage currents at an acceptable level, complex circuitries are typically designed so as to identify speed-critical paths and selectively form transistors of the speed critical-paths to have a low threshold voltage, while less critical signal paths may be realized on the basis of transistors of higher threshold voltage, thereby reducing static leakage currents while, however, also reducing switching speed of these transistors. For example, in modern central processing units (CPUs), several different "flavors" of transistors may be employed in order to take into consideration the different hierarchy with respect to signal processing speed. Consequently, during the complex implantation sequence for defining the dopant profile in the active regions of the transistors of different threshold voltage, an appropriate masking regime may be implemented in order to perform implantation processes on the basis of appropriately selected process parameters, in particular during the corresponding well implantation processes and halo implantation processes in combination with the shallow extension implantations to comply with the various design requirements with respect to implementing transistors of different threshold voltage. Although significant advances have been made with respect to obtaining a desired total performance of complex integrated circuits, while nevertheless not unduly increasing the overall static power consumption, it is nevertheless the goal of semiconductor manufacturers to increase performance of transistors, in particular of low threshold transistors, that is, to increase the drive current substantially without increasing the static leakage currents. In this respect, it has been proposed to enhance transistor performance for transistors by increasing the Miller capacitance by increasing the overlap of the drain and source extension regions with gate electrode structure. Although this concept may be a promising approach for enhancing transistor performance, an efficient implementation in well-established CMOS technologies may have to be realized.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods and semiconductor devices in which an increase of the Miller capacitance may be selectively obtained for transistor elements requiring a reduced threshold voltage by incorporating, in some illustrative aspects disclosed herein, techniques in the overall process flow in order to adapt a width of sidewall spacers prior to introducing a dopant species for forming drain and source extension regions. In this manner, the overlap and thus the Miller capacitance may be increased, substantially without requiring additional threshold implantation techniques during the definition of the well and halo regions. In other illustrative aspects disclosed herein, in addition to or alternatively to appropriately adapting the spacer width for transistors of the same conductivity type, the tilt angles may be selectively varied for defining the lateral dopant profile of transistors of different threshold voltage, thereby also providing an appropriately adapted Miller capacitance. For example, for low threshold transistors, an additional tilted extension implantation may be performed, thereby not only increasing the lateral penetration depth under the gate electrode structure but also increasing the overall dopant concentration, which may result in a more efficient modification of the Miller capacitance during subsequent anneal techniques. Consequently, an efficient adjustment of threshold voltages of transistors of the same conductivity type may be accomplished by adapting the Miller capacitance on the basis of an appropriate masking regime, which may not unduly contribute to overall process complexity, since, in some illustrative aspects, other masking steps, for instance for appropriately defining different threshold voltage levels by means of halo and well implantations, may be omitted.

One illustrative method disclosed herein comprises forming a spacer layer above a first structure formed above a first active region of a semiconductor device. The spacer layer is also formed above a second structure that is formed above a second active region, wherein the first and second structures represent a gate electrode or a gate place holder structure of a first transistor and a second transistor, respectively. The first transistor receives a first threshold voltage and the second transistor receives a second threshold voltage that is higher than the first threshold voltage. The method additionally comprises forming a first spacer element on sidewalls of the first structure and a second spacer element on sidewalls of the second structure, wherein the first spacer element has a first width that is less than a second width of the second spacer element. Finally, the method comprises performing an implantation sequence on the basis of the first and second structures and the first and second spacer elements to form drain and source regions in the first and second active regions.

Another illustrative method disclosed herein comprises selectively introducing a first dopant species into a first active region by performing a first implantation process while masking a second active region. The first active region has formed thereon a first gate electrode structure or a first gate place holder structure of a first transistor and the second active region has formed thereon a second gate electrode structure or a second gate place holder structure of a second transistor, wherein the first and second transistors represent the same conductivity type. Additionally, the method comprises introducing a second dopant species into at least the second active region by a second implantation process, wherein the first and second dopant species create the same conductivity type and wherein the first and second implantation processes differ at least in a tilt angle.

One illustrative semiconductor device disclosed herein comprises a first transistor of a first conductivity type that has a first threshold voltage and that comprises a first gate electrode structure comprising a first sidewall spacer structure having a first width. The semiconductor device further comprises a second transistor of the first conductivity type having a second threshold voltage that is higher than the first threshold voltage, wherein the second transistor comprises a second gate electrode structure including a second sidewall spacer structure having a second width that is greater than the first width.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques and semiconductor devices in which the threshold voltage of transistors may be adjusted by appropriately creating a Miller capacitance of specified magnitude in order to obtain a desired high saturation current while nevertheless maintaining the off current at a low level. Consequently, the leakage currents of high performance transistors, i.e., of transistors providing a high drive current due to a reduced threshold voltage, may be maintained at a low level, thereby also maintaining the static leakage currents at a low level. This may be accomplished by implementing efficient manufacturing techniques that enable the increase of the overlap of the drain and source extension regions with the gate electrode structure without unduly contributing to overall process complexity compared to conventional strategies, in which the threshold voltage may typically be adjusted on the basis of selectively performed well and halo implantation processes. For this purpose, in some illustrative embodiments, the spacer structure may by provided with a reduced width for transistors requiring a low threshold voltage, thereby increasing the lateral distance of dopant species below the gate electrode structure after completing the basic transistor fabrication processes, thereby resulting in an increased Miller capacitance. The increased Miller capacitance may in turn provide a reduced threshold voltage, even if other structural measures, such as well dopant profile and halo implantation, may be identical for transistors of the same conductivity type. Thus, if a plurality of different types of transistor of the same conductivity type, such as N-channel transistors of different threshold voltages and P-channel transistors of different threshold voltages, may be required, each desired threshold voltage may be associated with a corresponding spacer width, thereby enabling an efficient adaptation of the overall performance of the integrated circuit under consideration.

In other illustrative aspects disclosed herein, in addition to or alternatively to modifying the spacer width of at least some transistor types of different "flavor," the Miller capacitance may be adjusted on the basis of an implantation process performed by using a different tilt angle in order to appropriately adjust the lateral penetration of dopant species during the implantation processes for defining drain and source extension regions. For this purpose, an appropriate masking regime may be provided in which transistor areas for receiving transistors of reduced threshold voltage may experience at least one tilted implantation step in which a tilt angle may be greater compared to other transistor areas in which a reduced threshold voltage is to be established. Also, in this case, a plurality of different threshold voltages may be selected by providing an appropriate masking regime, in which at least a tilt angle may be varied for the different transistor areas in order to obtain a different degree of overlapping between the drain and source extensions and the gate electrodes. In some illustrative embodiments, the tilted implantation process may be performed additionally to an implantation process performed for other transistor areas requiring an increased threshold voltage, thereby concurrently increasing the overall dopant concentration in the low threshold voltage transistor, which may thus further contribute to enhanced device performance due to increased conductivity and an increased dopant gradient with respect to the adjacent channel region or halo region, thereby also providing an increased Miller capacitance. In some illustrative aspects, a very efficient adjustment of the Miller capacitance may be achieved by combining an appropriate adaptation of spacer width with tilted extension implantation processes so that a moderate difference of spacer width and the selected implantation parameters may nevertheless provide a significant difference in the resulting threshold voltages of different transistors.

Figure 1A:
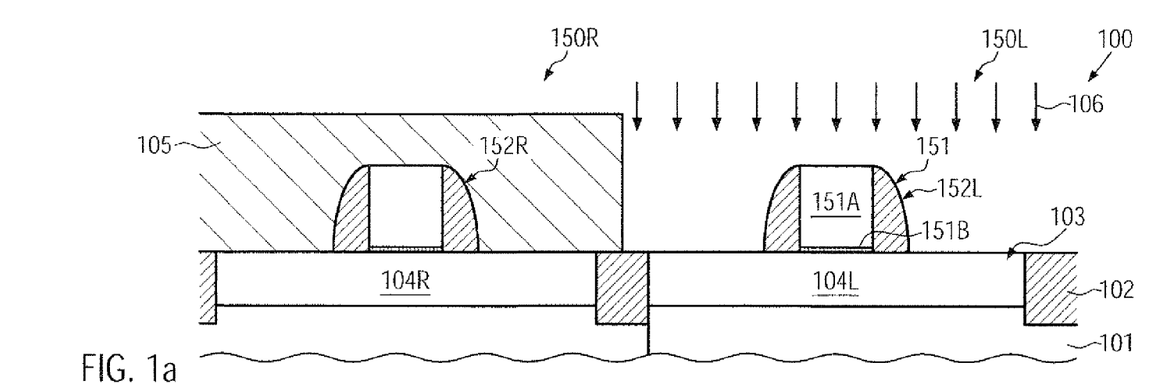
FIGS. 1a-1d schematically illustrate cross-sectional views of a semiconductor device comprising transistors of the same conductivity type and of different threshold voltage during various manufacturing stages in which a spacer structure for defining the lateral dopant profile may be reduced for the low threshold voltage transistor, according to illustrative embodiments.

FIG. 1*a* schematically illustrates a cross-sectional view of a semiconductor device 100, which may comprise a substrate 101 above which is formed a semiconductor layer 103. The substrate 101 may represent any appropriate carrier material, such as a semiconductor material, an insulating material and the like. The semiconductor layer 103 may represent a silicon-based layer since typically the vast majority of complex integrated circuits formed on the basis of CMOS technology may be fabricated by using silicon as a base material due to the virtually non-restricted availability and the well-known characteristics of this material. In other cases, the semiconductor layer 103 may include or receive other components, such as germanium, carbon and the like, in order to adjust the basic electronic characteristics of circuit elements to be formed in and above the semiconductor layer 103. In still other illustrative embodiments, the semiconductor layer 103 may represent any appropriate semiconductor compound in accordance with the overall device requirements. The substrate 101 and the semiconductor layer 103 may represent a silicon-on-insulator (SOI) configuration, at least locally within the device 100, by providing a buried insulating layer (not shown) between the substrate 101 and the semiconductor layer 103. In other cases, the semiconductor layer 103 may be formed on a substantially crystalline semiconductor material without providing an intermediate insulating material. It should be appreciated that both configurations, i.e., an SOI architecture and a bulk architecture, may be provided concurrently in the device 100, however at different device regions. In the manufacturing stage shown, the semiconductor device 100 may further comprise respective isolation structures 102, which may be provided in the form of shallow trench isolations and the like, in order to define a plurality of active regions 104L, 104R within the semiconductor layer 103. In this respect, an active region is to be understood as a semiconductor region in which the conductivity is adjusted, at least locally, by introducing appropriate dopant species to form, for instance, PN junctions, channel areas and the like. The active region 104L may represent the transistor active area of a first transistor 150L, which represents a transistor of a specific conductivity type, such as an N-type transistor or a P-type transistor, which may require a moderately low threshold voltage, as previously explained. On the other hand, the second active region 104R may represent the transistor active area of a second transistor 150R, which may be indicated as a transistor of regular threshold voltage, that is, the threshold voltage thereof may be higher than the threshold voltage of the transistor 150L. For example, the transistor 150L may be provided within a critical signal path of the semiconductor device 100, in which enhanced drive current may be required. On the other hand, the transistor 150R may be associated with a less critical signal path, thereby providing reduced drive current at the benefit of reduced static leakage currents.

Furthermore, the transistors 150L, 150R may comprise a gate electrode structure 151 or a place holder structure when an actual gate electrode structure is to be provided in a later manufacturing stage. For example, the gate electrode structure 151 may comprise a gate electrode or a place holder 151A, which may be comprised of any appropriate material, such as polysilicon and the like. Furthermore, a gate insulation layer 151B, or an appropriate place holder material, is provided, for instance in the form of a silicon dioxide-based material and the like. Additionally, a spacer structure 152L may be provided for the transistor 150L and a spacer structure 152R may be provided for the transistor 150R, which may have substantially the same configuration at the manufacturing stage shown in FIG. 1a. That is, the structures 152L, 152R may be comprised of substantially the same materials and may have substantially the same width, i.e., the design width may be the same, while process related variations may cause a difference in the actual spacer widths. Furthermore, as illustrated, an etch mask 105 may be provided to cover the second transistor 150R while exposing the first transistor 150L to an etch ambient 106.

The semiconductor device 100 as shown in FIG. 1a may be formed on the basis of the following processes. Prior to or after the formation of the isolation structure 102, which may involve sophisticated lithography, etch, deposition and planarization techniques, a desired dopant profile may be established in the active regions 104L, 104R in order to define the basic transistor characteristics. As previously explained, respective well implantation processes may conventionally be performed for transistors of the same conductivity type on the basis of a corresponding masking regime in order to adjust different threshold voltages. In some illustrative embodiments, the well implantation process for the active regions 104L, 104R may be performed as a common process, since a different threshold voltage may be adjusted on the basis of a different spacer width, as will be described later on in more detail. Next, the gate structures 151 may be formed by forming the gate insulation layers 151B on the basis of any appropriate and well-established process technique, followed by the deposition of the electrode material 151A, for instance in the form of polysilicon and the like, after which a patterning regime may be used in order to obtain the gate electrode structure 151 having a gate length, i.e., in FIG. 1a, the horizontal extension of the gate electrode material 151A, in accordance with the design rules. For example, for sophisticated integrated circuits, a gate length of 50 nm and significantly less is used. Next, the spacer structures 152L, 152R may be formed in a common manufacturing process, for instance by depositing a spacer layer using well-established deposition techniques, such as thermally activated chemical vapor deposition (CVD). The deposition may further include the deposition of etch stop liner, if required, such as a silicon dioxide material and the like, followed by an anisotropic etch process to preferably remove material from horizontal device portions, thereby maintaining the spacer structures 152L, 152R having substantially the same width, as explained above. Thus, the spacer width may be substantially determined by the initial layer thickness and the parameters of the corresponding etch process, which may be designed so as to obtain a desired offset to the gate electrode 151A, as is required for the transistor 150R. That is, the spacer structure 152R may be appropriately dimensioned in order to provide the ion blocking effect during a subsequent implantation sequence for forming drain and source extension regions, possibly in combination with any halo implantations, in order to obtain a desired regular threshold voltage for the transistor 150R. Next, the etch mask 105 may be formed, for instance in the form of a resist material, by employing well-established lithography techniques, thereby covering the transistor 150R while exposing the transistor 150L. Next, the etch ambient 106 may be established, for instance on the basis of similar process parameters as have previously been used during the etching of a spacer layer in order to provide the spacer structures 152L, 152R. Hence, during the etch process 106, further material of the spacer structure 152L may be removed, thereby reducing the spacer structure 152L in height and in width. In other illustrative embodiments, the etch ambient 106 may be provided in the form of an isotropic etch ambient, for instance using plasma assisted techniques or wet chemical etch recipes, such as hot phosphoric acid and the like, thereby tuning the width of the spacer structure 152L, while nevertheless maintaining a certain height in order to provide the required ion blocking effect during a subsequent implantation process.

Figure 1B:
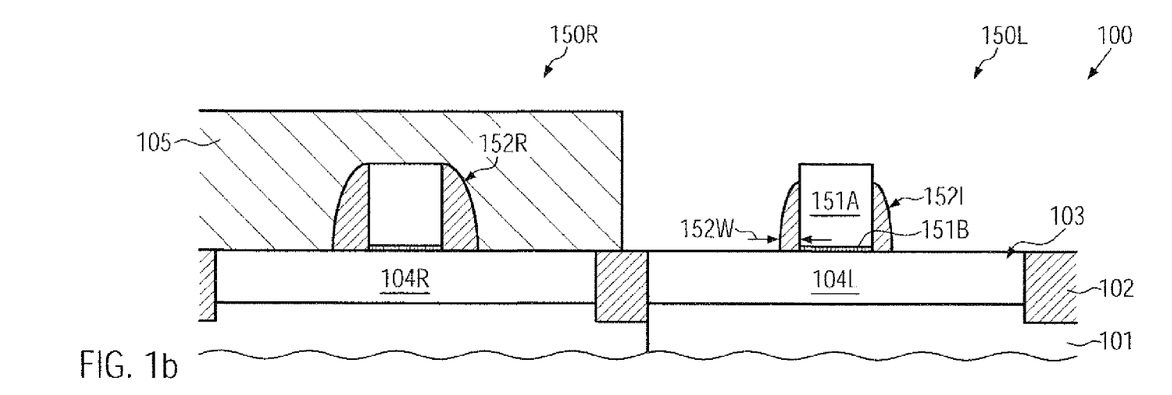

FIG. 1b schematically illustrates a cross-sectional view of the semiconductor device 100 after the etch process 106. Consequently, the spacer structure 152L may have a reduced width 152W, which may be appropriately selected such that, during the subsequent implantation processes, a desired degree of overlapping with the gate electrode 151A may be obtained for a given set of parameters for the subsequent processes, such as implantation processes, anneal processes and the like. It should be appreciated that the spacer structures 152L, 152R may represent specifically designed spacer elements, which may provide the desired offset of an extension region, wherein, in a later manufacturing stage, additional spacer elements may be added in order to obtain a complex lateral profiling of the drain and source regions. Also, in this case, a reduction of the spacer structure 152L in width may provide for a corresponding "shift" of the entire drain and source dopant profile in the transistor 150L towards the gate electrode 151A so that the desired drain and source internal dopant concentration profile may be maintained.

Figure 1C:
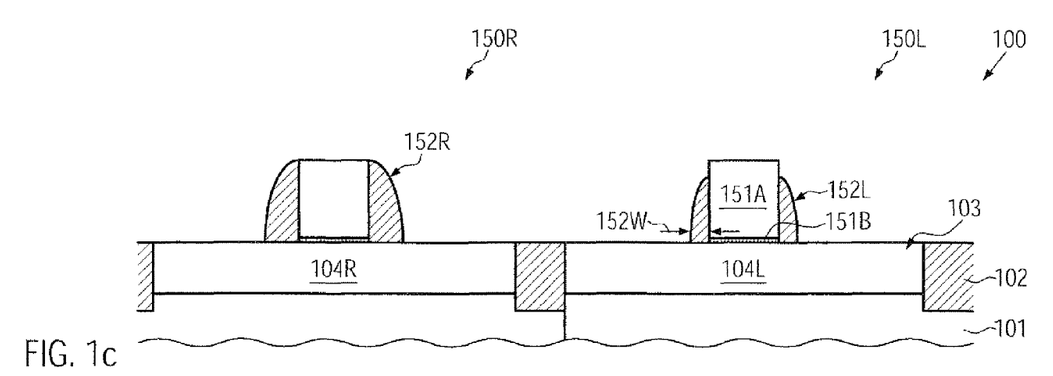

FIG. 1c schematically illustrates the semiconductor device 100 after removal of the etch mask 105, which may be accomplished by well-established resist removal processes, such as wet chemical recipes, plasma assisted processes and the like. It should be appreciated that, in some illustrative embodiments, when the previous implantation processes for, for instance, defining the well doping may be performed for transistors 150L, 150R as a common process, the overall cycle time of the device 100 may not be increased compared to conventional strategies, since in this case a respective implantation mask required for the selective well doping of the transistors of different threshold voltage in conventional devices may be omitted. Next, an implantation sequence may be performed in order to introduce a dopant species of a specific conductivity type into the transistors 150L, 150R wherein the reduced width 152W provides a reduced offset to the gate electrode material 151A, as previously explained.

Figure 1D:
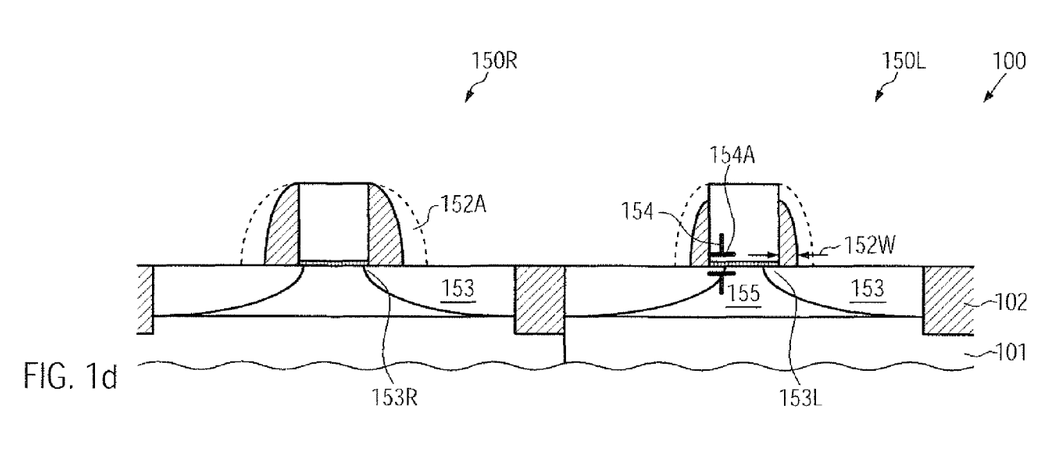

FIG. 1d schematically illustrates the semiconductor device 100 in a further advanced manufacturing stage. As illustrated, the transistors 150L, 150R may comprise drain and source regions 153 including respective extension regions 153L, 153R, respectively. Furthermore, as illustrated in dashed lines, the spacer structures 152L, 152R may comprise one or more additional spacer elements 152A if a pronounced lateral dopant profile may be required in the drain and source regions 153.

The semiconductor device 100 as shown in FIG. 1d may be formed on the basis of the following processes. Using the spacer structures 152L, 152R, a respective dopant species, such as an N-type dopant for N-channel transistors or a P-type dopant for P-channel transistors, may be introduced in a first implantation process while, prior to or after the implantation process, a halo implantation may be performed, if required. That is, a dopant species of opposite conductivity type compared to the dopant species forming the drain and source regions 153 may be introduced in order to adjust a degree of counter doping within the extension regions 153L, 153R and thereby adjusting a dopant gradient at the corresponding PN junction. Also, in this case, in some illustrative embodiments, substantially the same process conditions may be used during a halo implantation since the corresponding penetration depth of the dopant species may also be scaled proportionally to the extension regions 153L, 153R on the basis of the differently dimensioned spacer structures 152L, 152R. Consequently, in some illustrative embodiments, also a halo implantation process, if required, may be performed commonly for the transistors 150L, 150R. After forming the extension regions 153L, 153R, in some cases, an anneal process may be performed in order to activate dopants and initiate a certain degree of dopant diffusion, if required, to adjust the desired overlap of the regions 153L, 153R with the gate electrode material 151A. In other illustrative embodiments, an anneal process may be performed at a later stage if further implantation processes may be performed in order to obtain the drain and source regions 153. For example, as indicated by the spacer elements 152A, one or more additional spacer elements may be provided to increase the lateral size of an implantation mask formed by the gate electrode structures 151 and the spacer structures 152L, 152R, which may comprise the additional element 152A. After a respective formation of an additional spacer element, such as the element 152A, which may be accomplished on the basis of substantially the same techniques as previously described with reference to the spacer structures 152L, 152R, as illustrated in FIG. 1a, a further implantation process may be performed. When the final implantation process is completed, a corresponding anneal process may be performed, possibly on the basis of sophisticated anneal techniques, such as flashlight-based processes, laser-based anneal techniques and the like, in which process parameters may be used in order to provide a certain degree of dopant diffusion, wherein the reduced offset provided by the reduced width 152W may result in an increased overlap 154A in the transistor 150L compared to the transistor 150R, thereby providing an increased Miller capacitance 154. Consequently, the resulting threshold voltage for the transistors 150L, 150R may be different, where a reduced threshold voltage may be realized in the transistor 150L due to the increased coupling of the gate electrode material 151A into a channel region 155 of the transistor 150L.

Figure 1E:
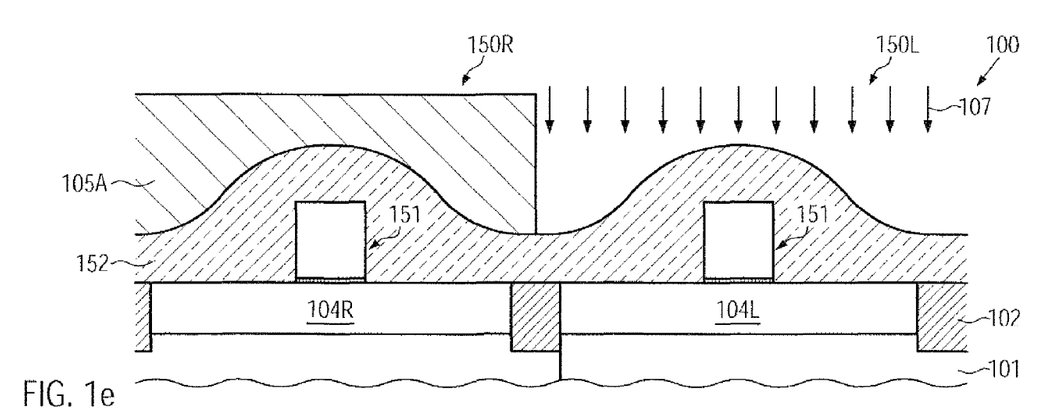
FIGS. 1e-1f schematically illustrate cross-sectional views of the semiconductor device with transistors of different threshold voltage during various manufacturing stages in which a spacer width may be reduced by selectively modifying the etch rate above one of the transistors by ion bombardment prior to forming the spacer elements in a common etch process, according to further illustrative embodiments.
Figure 1F:
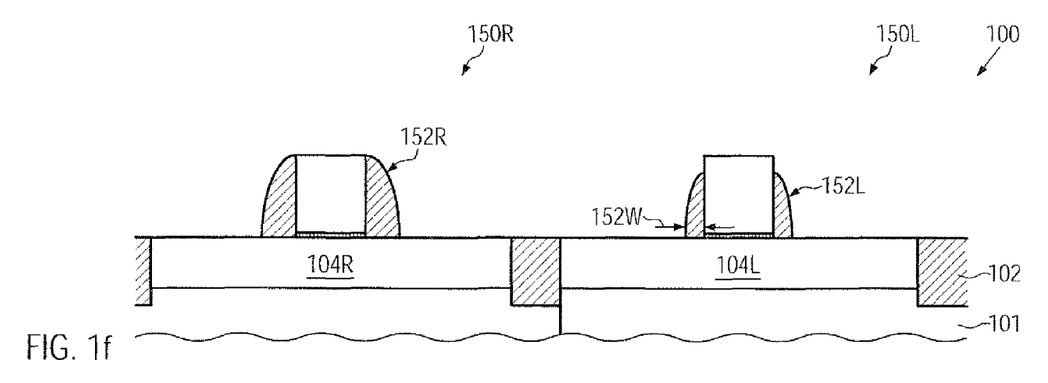

With reference to FIGS. 1e-1f, further illustrative embodiments will now be described in which the reduced width 152W may be accomplished by modifying the etch rate of a spacer layer prior to performing a common etch process.

FIG. 1e schematically illustrates the device 100 in a manufacturing stage in which a spacer layer 152, possibly in combination with an etch stop liner (not shown), is formed above the transistors 150L, 150R. Moreover, a mask 105A may be provided so as to cover a portion of the spacer layer 152 formed above the transistor 150R, while exposing the portion of the spacer layer 152 formed above the transistor 150L. The spacer layer 152, possibly in combination with an etch stop liner, may be formed on the basis of process techniques as previously described, followed by a lithography process for providing the mask 105A, for instance in the form of a resist material. Next, an ion bombardment 107 may be performed in order to modify the structure of the exposed portion of the spacer layer 152, thereby providing increased diffusion paths, which may thus modify the overall etch behavior of the exposed portion of the layer 152. For example, during the ion bombardment 107, for instance performed on the basis of an ion implantation process, an appropriate species, such as xenon, germanium, silicon and the like, may be introduced into the exposed portion of the layer 152, wherein a corresponding modifying effect during the bombardment 107 may readily be determined on the basis of simulation, experiments and the like. That is, for a given species, such as xenon, the penetration depth for specified implantation parameters may be calculated and/or determined by experiment, wherein also a corresponding change in etch rate may be determined in advance, for instance by running respective test measurements. Consequently, for a given initial layer thickness and a specific degree of etch rate modification, a difference in the final spacer width may be achieved in a well-controllable manner. Consequently, after removing the mask 105A, an etch process may be performed commonly for the transistors 150L, 150R by using determined etch parameters that may be selected such that a desired width of the resulting spacer structure may be achieved for the transistor 150R, while the preceding modification by the process 107 may result in a controllable reduction of the spacer width for the transistor 150L.

FIG. 1f schematically illustrates the device 100 after the above-described process sequence in which the spacer structure 152L may be provided with the reduced width 152W. Thereafter, the further processing may be continued as is also described with reference to FIG. 1d.

Figure 1G:
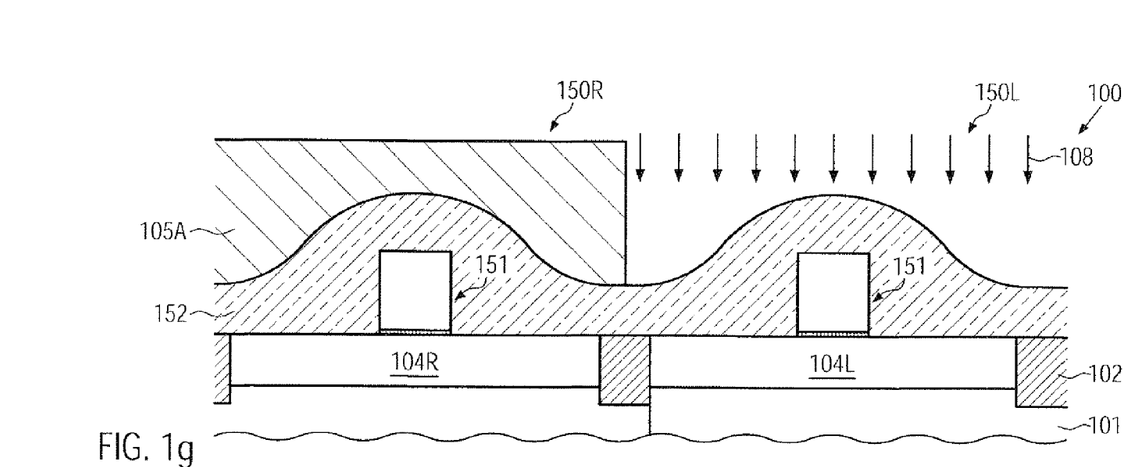
FIGS. 1g-1i schematically illustrate cross-sectional views of the semiconductor device including transistors of different threshold voltage at various manufacturing stages in which a reduced spacer width may be provided in the low threshold voltage transistor by selectively reducing a thickness of the spacer layer above the low threshold voltage transistor prior to performing a common etch process for forming the spacer elements, according to yet other illustrative embodiments.
Figure 1H:
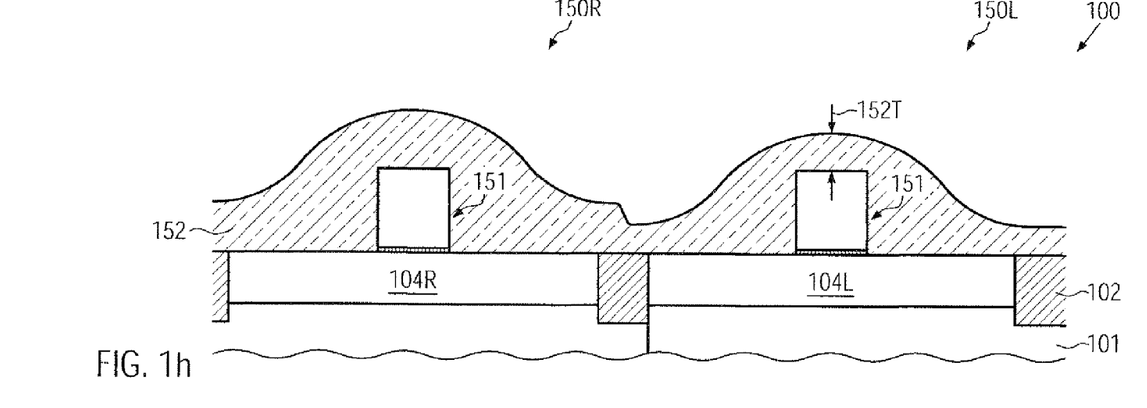
Figure 1I:
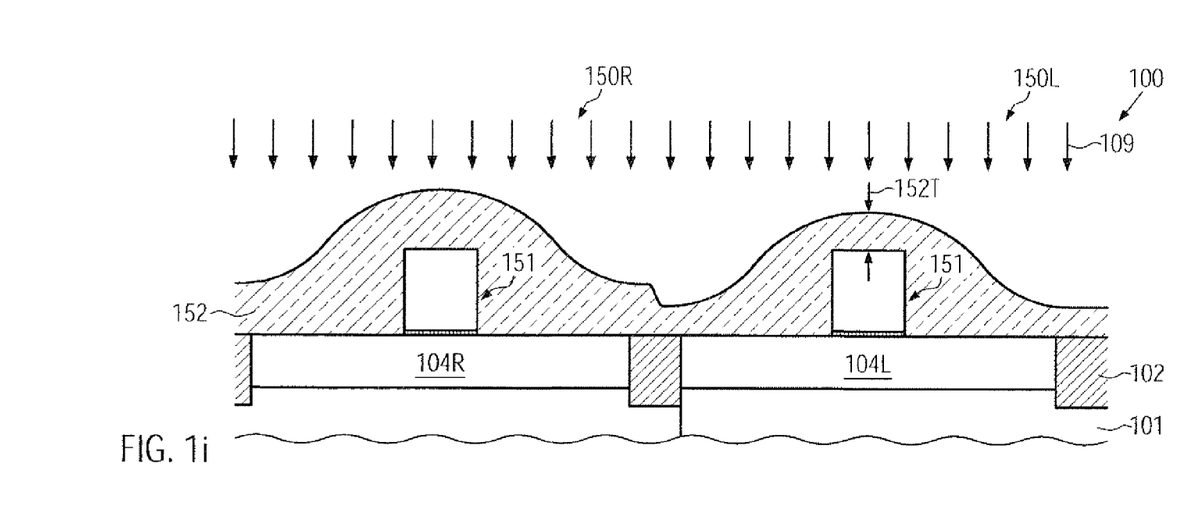

With reference to FIGS. 1g-1i, further illustrative embodiments will now be described in which additionally to or alternatively to a modification of the etch rate of the spacer layer 152 as described with reference to FIGS. 1e-1f, a reduction in layer thickness may be selectively employed in order to obtain a desired reduced width of the resulting spacer structure in the transistor 150L.

FIG. 1g schematically illustrates the device 100 with the spacer layer 152 and an etch mask 105A covering the transistor 150R while exposing the transistor 150L, i.e., the portion of the spacer layer 152 formed thereabove. Moreover, the device 100 is exposed to an etch ambient 108 which may be accomplished on the basis of a plasma assisted etch process, a wet chemical etch process and the like. For example, the etch ambient 108 may be established on the basis of substantially the same process conditions as may typically be used for forming spacer elements, thereby providing a certain etch-lag of the transistor 150R during a subsequent etch step after removal of the etch mask 105A. In other illustrative embodiments, the etch process 108 may be performed on the basis of a different etch recipe, for instance an isotropic etch process and the like, wherein also a specific selectivity with respect to other materials, such as an etch stop liner (not shown), which may be provided in combination with the spacer layer 152, may not be required, as long as a certain amount of material of the spacer layer 152 may be maintained above the transistor 150L. Thereafter, the mask 105A may be removed which, in some illustrative embodiments, may be accomplished in the same etch chamber in which the etch process 108 may be performed, thereby providing an efficient overall process flow.

FIG. 1h schematically illustrates the device 100 after the etch process 108 and the removal of the mask 105A. As illustrated, a thickness 152T of the spacer layer 152 above the transistor 150L is reduced, wherein the amount of thickness reduction may be adjusted on the basis of the etch time in the process 108 for a given set of etch parameters.

FIG. 1i schematically illustrates the semiconductor device 100 when exposed to an etch ambient 109, which may be established on the basis of appropriately selected parameters as are well established in the art for spacer etch processes. For example, the etch process 109 may be performed based on substantially the same process parameters as the process 108, thereby providing a highly efficient manufacturing flow, wherein, in some cases, the same process chamber may be used, thereby avoiding any additional transport activities. During the etch process 109, the reduced thickness 152T of the spacer layer 152 may result in a reduced width of the resulting spacer structure, as previously described. Consequently, after the etch process 109, the further processing may be continued, as described above, wherein the reduced width of the resulting spacer structure may provide the increased Miller capacitance in the transistor 150L.

Figure 1J:
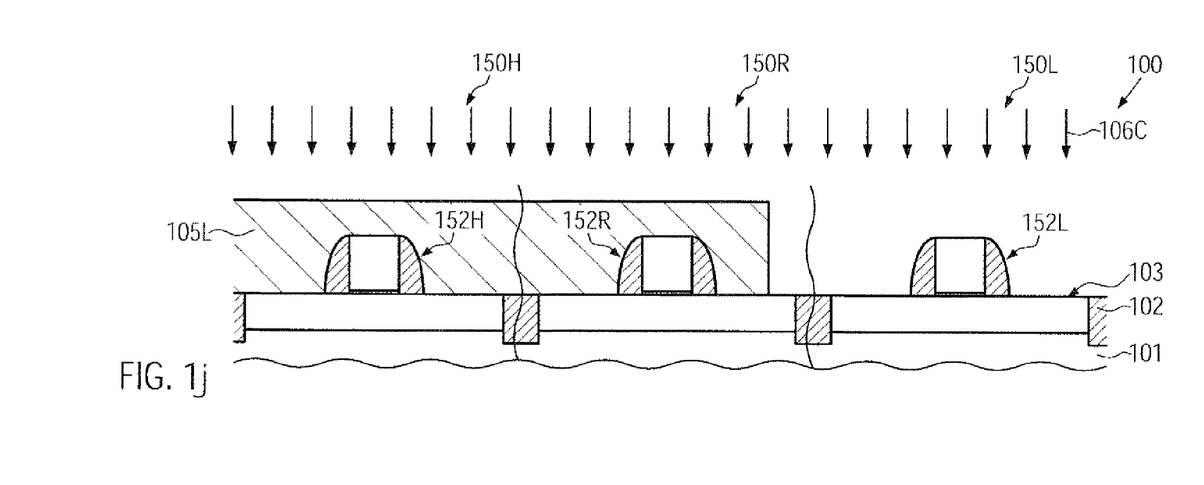
FIGS. 1*j*-1*l* schematically illustrate cross-sectional views of a semiconductor device including transistor elements of three different threshold voltages in various manufacturing stages in providing an appropriately adjusted spacer width for each of the transistors of different "flavor," according to further illustrative embodiments.
Figure 1K:
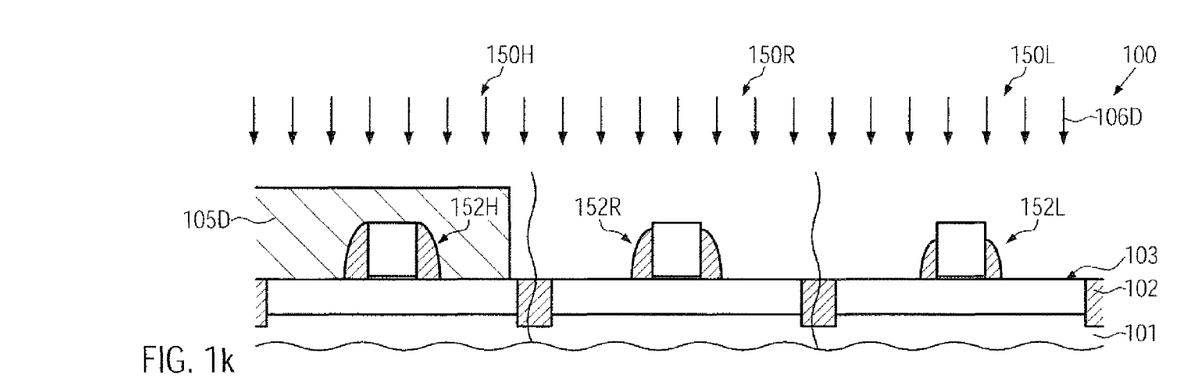
Figure 1L:
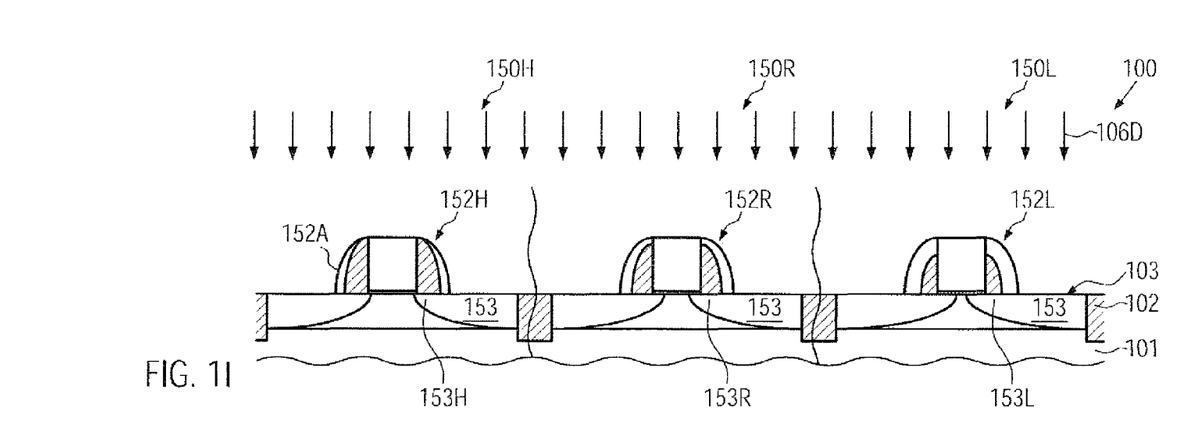

With reference to FIGS. 1j-1l, further illustrative embodiments will now be described in which a plurality of different threshold voltages may be established on the basis of correspondingly adapted spacer structures.

FIG. 1j schematically illustrates the device 100 comprising the transistors 150L, 150R and also comprising a transistor 150H, which may require a threshold voltage that is higher than the threshold voltage of the transistor 150R. In the manufacturing stage shown, a mask 105L may be provided to cover the transistors 150H, 150R, while exposing the transistor 150L. Moreover, the semiconductor device 100 is exposed to an etch ambient 106C designed to selectively remove material from the spacer structure 152L, wherein the mask 105L may prevent material removal of the spacer structure 152R of the transistor 150R and of a spacer structure 152H of the transistor 150H. With respect to any specifics of the etch process 106C, the same criteria apply as previously explained with reference to the etch process 106 (FIG. 1a).

FIG. 1k schematically illustrates the semiconductor device 100 in an advanced manufacturing stage in which a further etch mask 105D may be provided to cover the transistor 150H while exposing the transistors 150R, 150L to an etch ambient 106D. During the etch process 106D, the spacer structure 152L may be further reduced in thickness and also in height. Similarly, the spacer structure 152R may be reduced in thickness and height, thereby adjusting the desired spacer width for the transistors 150R, 150L. On the other hand, the transistor 150H may still have the initial spacer width which may be selected such that a desired high threshold voltage may be achieved for the transistor 150H during the further processing of the device 100.

FIG. 1l schematically illustrates the semiconductor device 100 in an advanced manufacturing stage. As shown, drain and source regions 153 may be formed, each of which may have corresponding extension regions. That is, the transistor 150L has the extension regions 153L with increased overlap with the gate electrode material 151A. Similarly, the transistor 150R may have the extension region 153R having a less pronounced overlap, while the transistor 150H, requiring the highest threshold voltage, may have a very small overlap, if at all, between its extension region 153H and the gate electrode material 151A. Furthermore, the spacer structures 152L, 152R, 152H may, if required, comprise additional spacer elements, such as the spacer element 152A (FIG. 1d) in order to provide a sophisticated lateral concentration profile in the drain and source regions 153, as previously explained. Consequently, a plurality of different transistor "flavors" may be obtained on the basis of an appropriately designed spacer width. It should be appreciated that the above masking regime may also be applied to the techniques including a selective modification of the etch rate and/or a selective etch step, such as the etch process 108 (FIG. 1g).

Figure 2A:
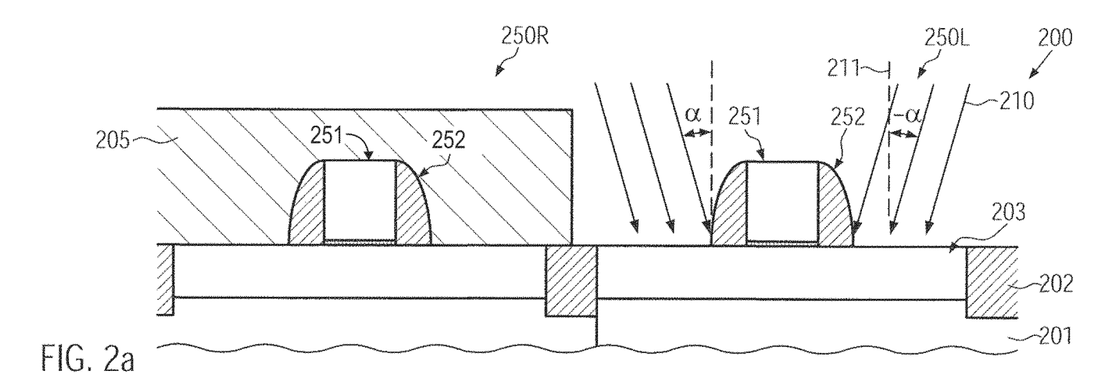
FIGS. 2*a*-2*b* schematically illustrate cross-sectional views of a semiconductor device including transistors of different threshold voltage wherein the Miller capacitance may be increased by selectively performing a tilted implantation process, according to yet other illustrative embodiments.
Figure 2B:
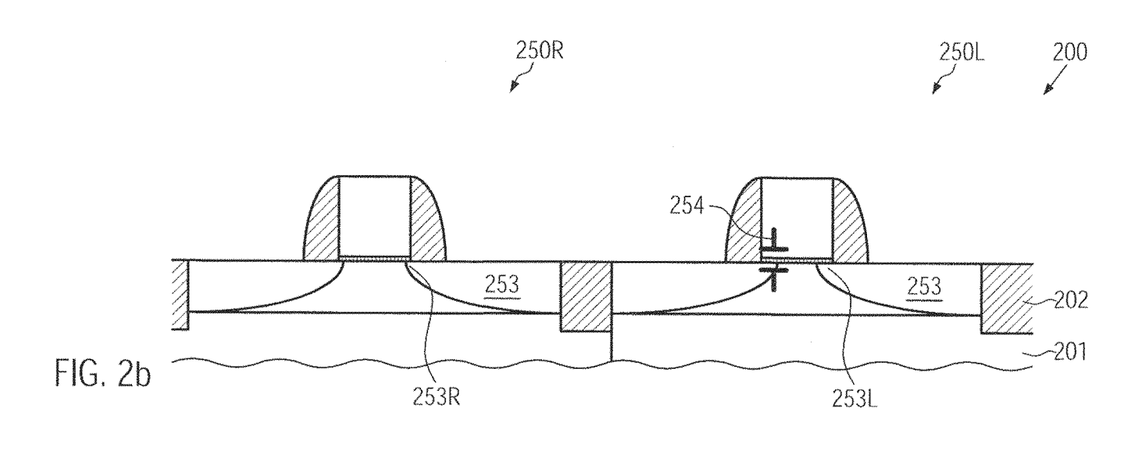

With reference to FIGS. 2a-2b, further illustrative embodiments will now be described in which an increase of the Miller capacitance may be accomplished by using an implantation process with a tilt angle during incorporation of the extension dopants.

FIG. 2a schematically illustrates a semiconductor device 200, which may basically have the same configuration as the semiconductor device 100 as shown in FIG. 1a. Hence, respective components may be denoted with the same reference numerals except for the first digit, which may be a "2" instead of a "1", and a detailed description of the corresponding components may be omitted. Thus, the device 200 may comprise a substrate 201 and a semiconductor layer 203 including isolation structures 202 to define active regions for transistors 250L, 250R, which may be of the same conductivity type and may receive different threshold voltages, as explained above. The transistors 250L, 250R may comprise a gate electrode structure 251 in combination with a spacer structure 252. Furthermore, the transistor 250R may be covered by a mask 205, such as a resist mask, while the transistor 250L may be exposed.

The semiconductor device 200 as shown in FIG. 2a may be formed on the basis of the same process techniques as previously described with reference to FIG. 1a. Furthermore, in this manufacturing stage, the device 200 may be subjected to an implantation process 210, which may be performed by using a tilt angle in order to increase the lateral penetration depth of the corresponding dopant species. It should be appreciated that a tilted implantation is to be understood as an implantation process in which the incoming ion beam arrives at an angle with respect to the surface normal 211 that is non-zero, as indicated by the angle α. As illustrated, if a symmetric configuration of the overlaps between the drain and source extensions is desired, the implantation process 210 may also comprise a tilted implantation step with an angle −α. In other cases, an asymmetric extension design may be used, depending on the overall device requirements. In one illustrative embodiment the implantation process 210 including the tilt angle α may be performed prior to forming extension regions in the transistor 250R, while, in other cases, the process 210 may be performed after providing a desired extension dopant concentration in the transistor 250R, and possibly in the transistor 250L. In the latter case, the transistor 250L may, in addition to an increased lateral penetration depth and thus overlap, also receive an increased dopant concentration, which may also contribute to enhanced transistor performance, for instance in view of reduced series resistance, increased dopant diffusion and thus Miller capacitance. In some illustrative embodiments, the mask 205 may be removed and a further implantation process may be performed to define extension regions in the transistor 250R wherein, depending on the overall process strategy, the transistor 250L may remain non-covered, thereby further increasing the previously provided dopant concentration, while in other cases the transistor 250L may be covered by a corresponding implantation mask.

FIG. 2b schematically illustrates the semiconductor device 200 in an advanced manufacturing stage. That is, after the tilted implantation process 210, in combination with a further implantation process using a tilt angle of zero or using at least a tilt angle that is less than the tilt angle α in the process 210, additional implantation processes may be performed, if required, by, for instance, using additional spacer elements, as previously explained, in order to obtain the desired overall dopant profile. Thereafter, appropriate anneal processes may be performed, as previously explained, thereby adjusting the final dopant profile and also reducing implantation-induced lattice damage. Hence, corresponding drain and source regions 253 are formed in the semiconductor layer 203, wherein an extension region 253L of the transistor 250L may provide an increased Miller capacitance 254 compared to extension regions 253R of the transistor 250R. Thus, also in this case, a reduced threshold voltage may be achieved for the transistor 250L on the basis of the tilted implantation process 210.

It should be appreciated that in other illustrative embodiments a plurality of different threshold voltages may be obtained by using an appropriate masking regime, as is, for instance, explained with reference to device 100 and FIGS. 1j-1l, wherein, for a plurality of different transistors, at least different tilt angles, possibly in combination with different total concentrations of the extension regions, may be used in appropriately adjusting the corresponding threshold voltages. Moreover, in other illustrative embodiments, the implantation process 210 may be combined with process techniques as previously described in which the transistor requiring the lowest threshold voltage may additionally be provided with a reduced spacer width, thereby even further enhancing the efficiency of the tilted implantation process 210. In this case, a moderately less pronounced difference, for instance in spacer width and/or tilt angle and/or dopant concentration, in corresponding transistors may, in combination, result in a moderately high difference of the respective threshold voltages, thereby providing an efficient overall mechanism for adjusting different threshold voltages, while not unduly contributing to the overall process complexity. That is, respective implantation masks may also be used as etch masks, thereby avoiding undue lithography steps. For example, starting from the semiconductor device 200 as shown in FIG. 2a, the tilted implantation process 210 may be performed and thereafter the mask 205 may be used as an etch mask for reducing the width of the spacer structure 252 of the transistor 250L, prior to performing a common implantation process after removal of the mask 205 in order to form the extension regions 253R of the transistor 250R, while also increasing the dopant concentration in the transistor 250L.

As a result, the present disclosure provides manufacturing techniques and semiconductor devices in which an efficient adjustment of threshold voltages may be accomplished by appropriately adapting a spacer width and/or a tilt angle of an implantation process in order to provide different overlaps and thus Miller capacitance values of transistors of the same conductivity type. Hence, compared to conventional strategies, a moderately low threshold voltage may be achieved by increasing the Miller capacitance, which may result in superior transistor performance compared to conventional low threshold transistors, since the universal curve of low threshold voltage transistors obtained on the basis of an increased Miller capacitance may indicate a reduced static leakage current for a given desired saturation current.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
forming a layer of spacer material above a first structure of a first transistor formed above a first active region of a semiconductor device and a second structure of a second transistor formed above a second active region of said semiconductor device;
selectively reducing a thickness of said layer of spacer material above said first active region;
after selectively reducing said thickness of said layer of spacer material above said first active region, forming a first spacer element having a first width on sidewalls of said first structure and a second spacer element having a second width that is different than said first width on sidewalls of said second structure; and
after forming said first and second spacer elements, performing an implantation sequence comprising a first implantation process performed at a first non-zero tilt angle to introduce a first dopant species into said first active region and a second implantation process performed at a second non-zero tilt angle that is different than said first non-zero tilt angle to introduce a second dopant species into at least said second active region.

2. The method of claim 1, wherein said first and second structures comprise at least one of a gate electrode structure and a gate electrode place holder structure of said first transistor and said second transistor, respectively.

3. The method of claim 1, wherein selectively reducing said thickness of said layer of spacer material above said first active region comprises forming an etch mask above said second active region and performing an etch process to remove at least an upper portion of said layer of spacer material from above an upper surface of said first structure, wherein a thickness of a remaining lower portion of said layer of spacer material above said upper surface of said first structure is less than a thickness of said layer of spacer material above an upper surface of said second structure.

4. The method of claim 1, wherein forming said first and second spacer elements comprises performing an etch process.

5. The method of claim 1, further comprising selectively modifying an etch rate of said layer of spacer material above said first active region.

6. The method of claim 5, wherein selectively modifying said etch rate comprises performing an ion bombardment process to selectively implant an ion species into said layer of spacer material above said first active region.

7. The method of claim 6, wherein performing said ion bombardment process comprises implanting a xenon ion species.

8. The method of claim 1, wherein performing said implantation sequence further comprises forming at least one additional spacer element on at least one of said first and second spacer elements.

9. A method, comprising:
  forming a first gate electrode structure of a first transistor having a first threshold voltage above a first active region of a semiconductor device;
  forming a second gate electrode structure of a second transistor having a second threshold voltage that is different than said first threshold voltage above a second active region of said semiconductor device;
  forming a spacer material layer above said first and second active regions;
  selectively modifying the etch rate of said spacer material layer above said first active region;
  performing a first etch process to selectively reduce a thickness of said spacer material layer above said first active region;
  after performing said first etch process, performing a second etch process to form a first sidewall spacer structure having a first width on said first gate electrode structure and a second sidewall spacer structure having a second width different than said first width on said second gate electrode structure; and
  after forming said first and second sidewall spacer structures, performing an implantation sequence comprising at least two implantation processes to form drain and source regions in said first and second active regions, wherein a non-zero tilt angle used to perform a first of said at least two implantation processes is different than a non-zero tilt angle used to perform a second of said at least two implantation processes.

10. The method of claim 9, wherein at least one of said first and second gate electrode structures comprises a gate electrode place holder structure.

11. The method of claim 9, wherein a thickness of said spacer material layer above an upper surface of said first gate electrode structure after performing said first etch process is less than a thickness of said spacer material layer above an upper surface of said second gate electrode structure.

12. The method of claim 9, wherein selectively modifying said etch rate comprises performing an ion bombardment process to selectively implant an ion species into said spacer material layer above said first active region.

13. The method of claim 12, wherein said ion bombardment process is performed prior to selectively reducing said thickness of said spacer material layer.

14. The method of claim 9, wherein a conductivity type of said first transistor is the same as a conductivity type of said second transistor.

15. The method of claim 9, wherein performing said implantation sequence further comprises forming at least one additional spacer element on at least one of said first and second sidewall spacer structures.

16. The method of claim 1, wherein a conductivity type of said first transistor is the same as a conductivity type of said second transistor.

17. The method of claim 1, wherein said first transistor has a first threshold voltage and said second transistor has a second threshold voltage that is different than said first threshold voltage.

* * * * *